United States Patent
Roohparvar

(10) Patent No.: US 7,564,721 B2
(45) Date of Patent: Jul. 21, 2009

(54) METHOD AND APPARATUS FOR IMPROVING STORAGE PERFORMANCE USING A BACKGROUND ERASE

(75) Inventor: Frankie Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 262 days.

(21) Appl. No.: 11/442,514

(22) Filed: May 25, 2006

(65) Prior Publication Data

US 2007/0274134 A1    Nov. 29, 2007

(51) Int. Cl.
G11C 16/04 (2006.01)

(52) U.S. Cl. .............. 365/185.33; 365/185.29; 365/194; 365/191

(58) Field of Classification Search ........... 365/185.33, 365/185.29, 194, 191
See application file for complete search history.

(56) References Cited

U.S. PATENT DOCUMENTS

| | | | |
|---|---|---|---|
| 5,341,330 | A | 8/1994 | Wells et al. |
| 5,867,641 | A | 2/1999 | Jenett |
| 6,279,069 | B1 | 8/2001 | Robinson et al. |
| 6,621,746 | B1 | 9/2003 | Aashiem et al. |
| 6,643,731 | B2 | 11/2003 | Lu et al. |
| 6,715,027 | B2 | 3/2004 | Kim et al. |
| 6,760,805 | B2 | 7/2004 | Lasser |
| 6,895,464 | B2 | 5/2005 | Chow et al. |
| 6,901,499 | B2 | 5/2005 | Aasheim et al. |
| 6,922,758 | B2 | 7/2005 | Roohparvar |
| 6,975,538 | B2 | 12/2005 | Abedifard et al. |
| 2001/0034809 | A1* | 10/2001 | Ogawa ............... 711/103 |
| 2001/0052062 | A1* | 12/2001 | Lipovski ............. 712/32 |
| 2002/0048193 | A1 | 4/2002 | Tanikawa et al. |
| 2003/0099134 | A1 | 5/2003 | Lasser et al. |
| 2003/0145151 | A1 | 7/2003 | Matsushita et al. |
| 2005/0273548 | A1 | 12/2005 | Roohparvar |
| 2005/0273549 | A1 | 12/2005 | Roohparvar |
| 2006/0184720 | A1* | 8/2006 | Sinclair et al. ........ 711/103 |
| 2006/0184722 | A1* | 8/2006 | Sinclair ............... 711/103 |

FOREIGN PATENT DOCUMENTS

WO    WO2005066770 A2    7/2005

OTHER PUBLICATIONS

International Search Report dated Feb. 6, 2008, for International Application No. PCT/US2007/012416 (5 pages).

* cited by examiner

*Primary Examiner*—Thong Q Le
(74) *Attorney, Agent, or Firm*—TraskBritt

(57) ABSTRACT

Disclosed are an apparatus, method, and computer readable medium configured for performing a background erase in a memory device. Included is the act of receiving at least one erase command and at least one erasable block address for the memory device. Also included is the act of asserting a background-process-busy flag after receiving the at least one erase command and the at least one erasable block address. At least one block in the memory associated with the at least one erasable block address is erased, wherein the erasing occurs at a time delay after receiving the at least one erase command if a background enable flag is asserted. Finally, the background-process-busy flag is negated after the erasing is complete.

46 Claims, 6 Drawing Sheets

METHOD AND APPARATUS FOR IMPROVING STORAGE PERFORMANCE USING A BACKGROUND ERASE

BACKGROUND OF THE INVENTION

1. Field of the Invention

This invention relates generally to nonvolatile memory devices and, more particularly, to erasing portions of the nonvolatile memory devices.

2. Description of Related Art

Nonvolatile memory devices are provided in many electronics devices such as personal computers, personal digital assistants, digital cameras, and digital music players. Nonvolatile memory devices, such as flash memory devices and other Electrically Erasable Programmable Read Only Memories (EEPROM) have many advantages over other types of data storage devices, both volatile and nonvolatile. Unlike magnetic and optical devices, such as hard-disk, Compact Discs (CD), and Digital Versatile Discs (DVD), nonvolatile memory devices include no moving parts. Unlike other nonvolatile semiconductor memories, such as Read Only Memories (ROM), nonvolatile memory devices may be reprogrammed. Finally, unlike other semiconductor memories, such as Random Access Memories (RAM) and Dynamic Random Access Memories (DRAM), nonvolatile memory devices retain their data values even after power is removed from the device.

However, nonvolatile memories, such as flash memories, include many characteristics that are different from other semiconductor memories. One significant difference is that the individual bit cells in flash memory devices, once programmed, cannot be directly programmed to a new value. Instead, once a bit cell is programmed, it must be erased before it can be programmed again. Conventionally, a bit is defined as a "1" when it is erased and a "0" when it is programmed. In addition, flash memories may be programmed as 8-bit bytes or 16-bit words. Thus, a byte/word is originally erased to all ones then programmed to the intended value, which is likely a combination of ones and zeros. To reprogram the byte/word to a new value, it must first be erased to all ones, and then reprogrammed to the new value. Furthermore, flash memories generally cannot be erased on a byte/word basis. Rather, all bits within a relatively large block are erased at the same time.

This block erase operation may stall other operations in the flash memory, such as read and write operations. In addition, it may be desirable to retain some information in a block while removing other information. Thus, before a block is erased, the retainable information may need to be copied to a new block, before the block is erased. With these limitations, many flash memory systems attempt to perform block erase operations at initialization or power down. However, if block erase operations are performed during initialization, the flash memory device may be unavailable for long periods during the initialization, which may cause a significantly noticeable adverse impact on performance. Block erase operations performed during power down can also pose significant problems. Many flash memory systems use transient power, wherein the system cycles between power on and power off to the flash memory devices quite frequently in an attempt to save power. In these systems, it may not always be predictable when power is going to be removed from a flash memory device or flash memory card. If power is removed from a flash memory device while a block is being erased, the block may not be fully erased, even though the flash memory system "believes" it has been erased. Thus, when the block is programmed again, the data may not be written correctly because the block was not fully erased.

There is a need for a method and apparatus that provides a means for performing block erases in a background mode to reduce performance impacts and provide for developing a time period wherein the flash memory system may be confident that blocks are properly erased even in a transient power system.

BRIEF SUMMARY OF THE INVENTION

The present invention provides a method and apparatus for performing block erases in a background mode, which may increase overall memory performance and develop a time period wherein the flash memory system may be confident that blocks are properly erased even in a transient power system.

An embodiment of the present invention includes a memory device organized in a plurality of erasable blocks. The memory device comprises a background-process-busy flag and a background controller. The background controller is configured for receiving at least one erase command and at least one erasable block address. The background controller is also configured for asserting the background-process-busy flag and generating commands for erasing at least one of the plurality of erasable blocks associated with the at least one erasable block address. This erasing occurs at a time delay after receiving the at least one erase command. The background controller is also configured for negating the background-process-busy flag after the erasing is complete.

Another embodiment of the present invention comprises a memory card, which includes at least one memory device organized in a plurality of erasable blocks and a memory controller operably coupled to the at least one memory device. The memory controller includes a background-process-busy flag, and a background controller. The background controller is configured for receiving at least one erase command and at least one erasable block address. The background controller is also configured for asserting the background-process-busy flag and generating commands for erasing at least one of the plurality of erasable blocks associated with the at least one erasable block address. This erasing occurs at a time delay after receiving the at least one erase command. The background controller is also configured for negating the background-process-busy flag after the erasing is complete.

Another embodiment of the present invention comprises a memory system, which includes at least one memory device organized in a plurality of erasable blocks and a processor operably coupled to the at least one memory device. The processor includes a background-process-busy flag, and a background controller. The background controller is configured for receiving at least one erase command and at least one erasable block address. The background controller is also configured for asserting the background-process-busy flag and generating commands for erasing at least one of the plurality of erasable blocks associated with the at least one erasable block address. This erasing occurs at a time delay after receiving the at least one erase command. The background controller is also configured for negating the background-process-busy flag after the erasing is complete.

Another embodiment of the present invention comprises one or more computer readable media having commands stored thereon, which when executed by a processor cause the processor to perform the act of receiving at least one erase command and at least one erasable block address for at least one memory device organized in a plurality of erasable blocks. The processor is also caused to perform the acts of asserting a background-process-busy flag and generating commands to the at least one memory device for erasing at least one of the plurality of erasable blocks associated with the at least one erasable block address. This erasing occurs at a time delay after receiving the at least one erase command. Finally, the processor is also caused to perform the act of negating the background-process-busy flag after the erasing is complete.

Another embodiment of the present invention comprises a method for performing a background erase in a memory device, wherein the method includes receiving at least one erase command and at least one erasable block address for the memory device. The method also includes asserting a background-process-busy flag after receiving the at least one erase command and the at least one erasable block address. The method also includes erasing at least one block in the memory associated with the at least one erasable block address, wherein the erasing occurs at a time delay after receiving the at least one erase command. Finally, the method includes negating the background-process-busy flag after the erasing is complete.

Yet another embodiment, in accordance with the present invention comprises another method for performing a background erase in a memory device, wherein the method includes receiving a power-down-soon flag. The method also includes determining if at least one erase command is pending for the memory device, and if so asserting a background-process-busy flag and erasing at least one block in the memory device associated with the at least one erase command. The method also includes negating the background-process-busy flag after the erasing is complete.

Yet another embodiment, in accordance with the present invention comprises another method for performing a background erase in a memory device. The method includes receiving a power-down-soon flag, and determining if at least one erase command is pending for the memory device. If the at least one erase command is pending, the method also includes transmitting an estimated completion time for the at least one erase time and erasing at least one block in the memory device associated with the at least one erase command.

BRIEF DESCRIPTION OF THE DRAWINGS

In the drawings, which illustrate what is currently considered to be the best mode for carrying out the invention.

DETAILED DESCRIPTION OF THE INVENTION

Figure 1:
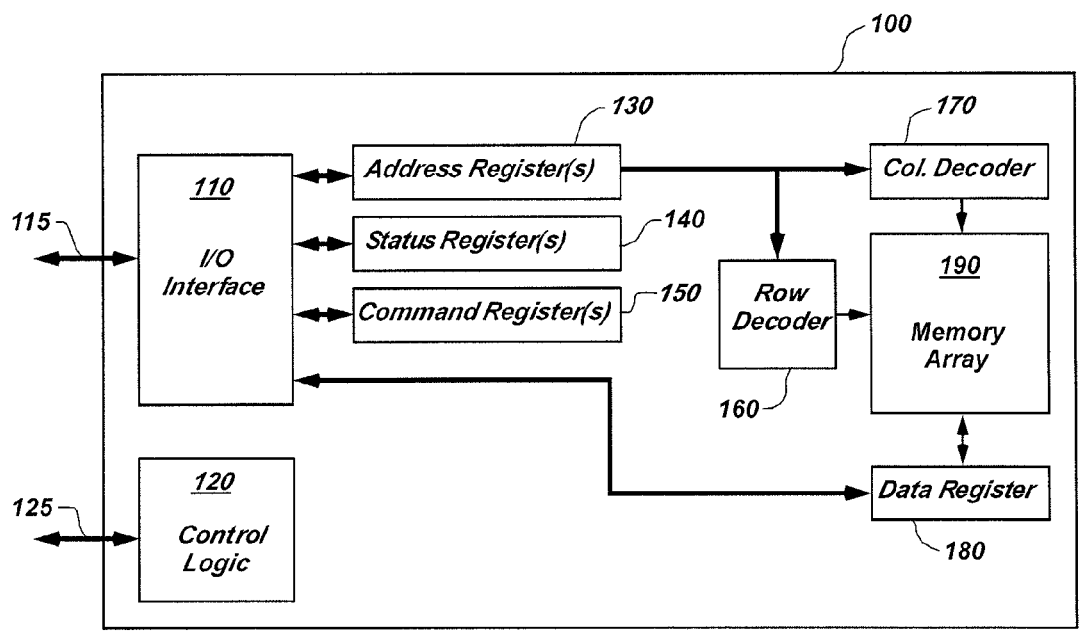
FIG. 1 is a schematic depiction of a representative embodiment of a memory device.

The present invention provides a method and apparatus for performing block erases in a background mode, which may increase overall memory performance and develop a time period wherein the flash memory system may be confident that blocks are properly erased even in a transient power system.

In the following description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

In this description, some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal. Furthermore, some signals may be referred to as having a state of asserted or negated. Similarly, data bits may be referred to as asserted or negated, or alternatively as set or cleared. Those of ordinary skill in the art will recognize that in most instances, the selection of asserted, negated, set, or cleared may be arbitrary and the invention could be implemented with the opposite states for such signals and bits.

Although the representative embodiment has been described with respect to a specific data width, page size, block size, and memory size, those of ordinary skill in the art will recognize that other embodiments with different values for data width, page size, block size, and memory size are easily contemplated within the scope of the present invention.

A memory device, as used herein, means any memory device that uses a block erase operation to erase a portion of the memory device, such as, for example, a flash memory device or an EEPROM memory device. In addition, the memory device may be referred to herein as a memory or a flash memory.

Background erase may be defined in other references as an erase that occurs in the background relative to a software environment wherein it appears to the software that the erase may be hidden from a software layer and occurs in the background relative to file and data accesses requested by the software. However, background erase, as used in the context of the present invention, refers to performing the erase operation in the background from the flash memory command perspective. In other words, background erases may occur relative to other operations or commands issued to a flash memory card or flash memory device.

FIG. 1 illustrates a block diagram of a representative embodiment of a memory device 100 according to the present invention. The block diagram of the memory device 100 has been simplified to focus on features of the memory that are helpful in understanding the present invention. A more detailed understanding of internal circuitry and functions of flash memories is known to those of ordinary skill in the art.

The memory device 100 includes an Input/Output (I/O) bus 115 coupled to an I/O interface 110. Also included is a control bus 125 coupled to control logic 120. While the control logic 120 does not show connections to internal functional blocks, those of ordinary skill in the art will recognize that the control logic 120 may include internal signals to any or all of the internal functional blocks. Generally, the control logic 120 uses signals on the control bus 125, in combination with the I/O bus 115, to recognize commands from an external device. Some of these commands may be for storing data from the I/O bus 115 in address register 130, data register 180, command register 150, or status register 140. Other commands may be for reading data to the I/O bus 115 from the data register 180, command register 150, or status register 140. Still other commands may be for programming a page in the memory device 100 or erasing a block in the memory device 100.

One or more address registers 130 capture addresses from the I/O interface 110. A portion of the address couples to a column decoder 170 to select the appropriate column(s) in a memory array 190, and to a row decoder 160 to select the appropriate row(s) in the memory array 190. When the memory array 190 is read, data from the memory array 190 is transferred to the data register 180. From the data register 180, data may be transferred out of the memory device 100 onto the I/O bus 115. To write data to the memory array 190, first data is written from the I/O bus 115 into the data register 180, and when enough data has been written to fill a page of the memory array 190, a command may be sent to the memory device 100 to transfer the data in the data register 180 to a page in the memory array 190.

Figure 2:
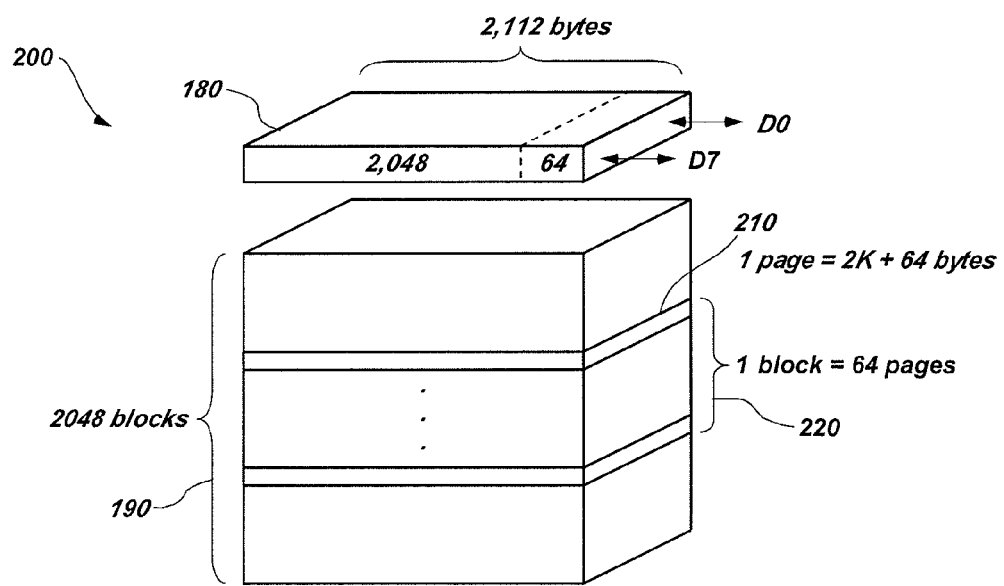
FIG. 2 is a schematic depiction of a representative logical organization for a memory device.

FIG. 2 illustrates a representative embodiment of a logical organization 200 for the memory array 190. The data register 180 may be organized with a depth of an 8-bit byte and a width of 2112 bytes. The 2112 byte width may be divided into a 2048 byte data region and a 64 byte extension region. In many flash memory devices, the extension region may be used for error management functions or other control functions.

A page 210 in the memory array 190 may be the same size as the data register 180. Thus, data is read from the memory area and transferred to the data register 180 a page at a time. Similarly, data is written to the data register 180 until an entire page of memory is ready to be programmed, and then data is transferred (programmed) from the data register 180 to the page 210 in the memory array 190.

A block 220 of the memory array 190 may include 64 pages 210. The entire memory array 190 may include 2048 blocks 220. Of course, those of ordinary skill in the art will recognize that many other logical organizations for the memory device are possible. Memory devices are frequently getting larger and memory devices may be available in a variety of bit widths (e.g., 8-bit bytes and 16-bit words). As a result, many other organizations for data widths, page sizes, block sizes, and logical partitioning between these various definitions for organization are possible and contemplated within the scope of the present invention.

Figure 3:
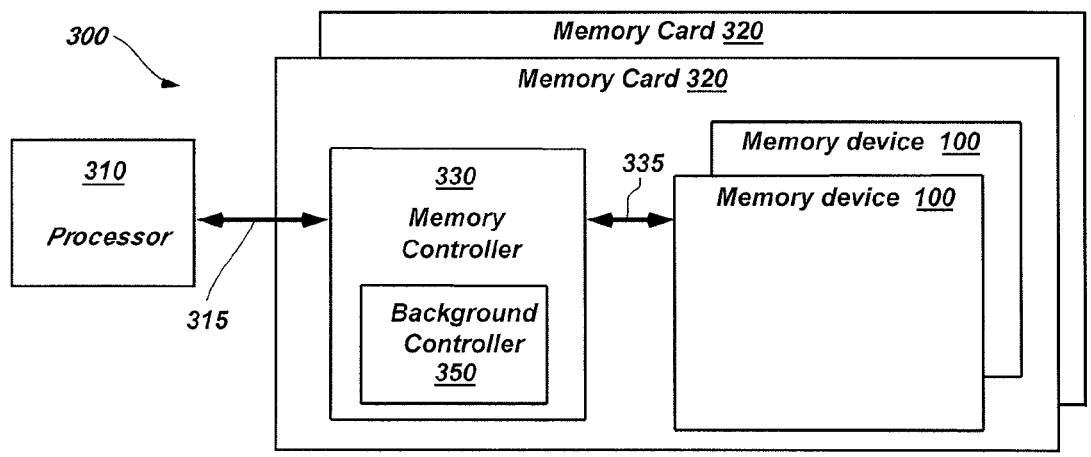
FIG. 3 is a schematic depiction of a memory system including a processor and representative embodiments of memory cards with a memory controller including a background controller and memory devices disposed thereon.

FIG. 3 illustrates a block diagram of a memory system 300 including a processor 310 and at least one memory card 320 wherein each memory card 320 includes a memory controller 330 and at least one memory device 100. The processor 310 communicates with the memory controller 330 across an external bus 315. The memory controller 330 communicates with the memory devices 100 across an internal bus 335.

A large number of memory devices 100 may be configured on memory cards 320 and there are many different types of memory cards 320, such as, for example, Compact Flash (CF) cards, MultiMedia Cards (MMC), Secure Digital (SD) cards, Smart Media (SM) cards, and Memory Stick (MS) cards.

Each of these cards may be used in many different types of host systems that may have different methodologies and protocols for communicating with the memory controller 330 on the memory card 320. These host systems may include electronic devices such as, for example, personal computers, personal digital assistants, digital cameras, and digital music players. The host system is represented by the block designated as the processor 310.

The memory controller 330 translates external bus 315 cycles from the processor 310 into commands that memory devices 100 understand, and then presents those commands on the internal bus 335 for the memory devices 100. In addition, the memory controller 330 may manage data movement and data traffic to the external bus 315 as well as the internal bus 335.

Figure 3A:
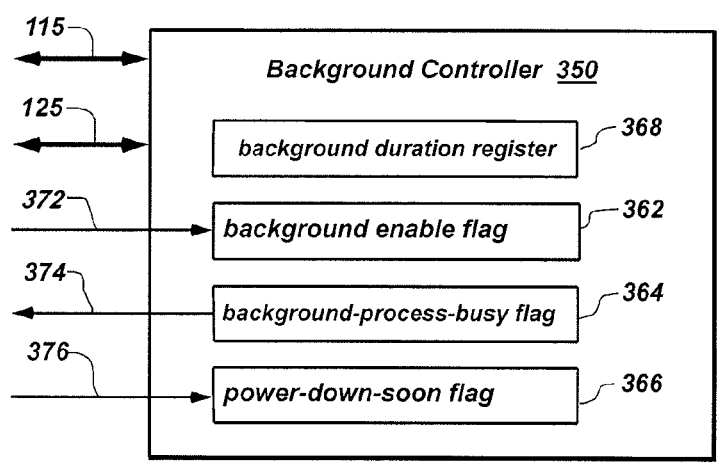
FIG. 3A is a schematic depiction of a background controller according to the present invention.

A background controller 350 may be implemented in the memory controller 330. The background controller 350, as illustrated in FIG. 3A, includes logic and flags for managing operations of erase commands in a background mode, which may be controlled with I/O bus 115 and control bus 125. The background controller 350 is explained in detail below.

Figure 4:
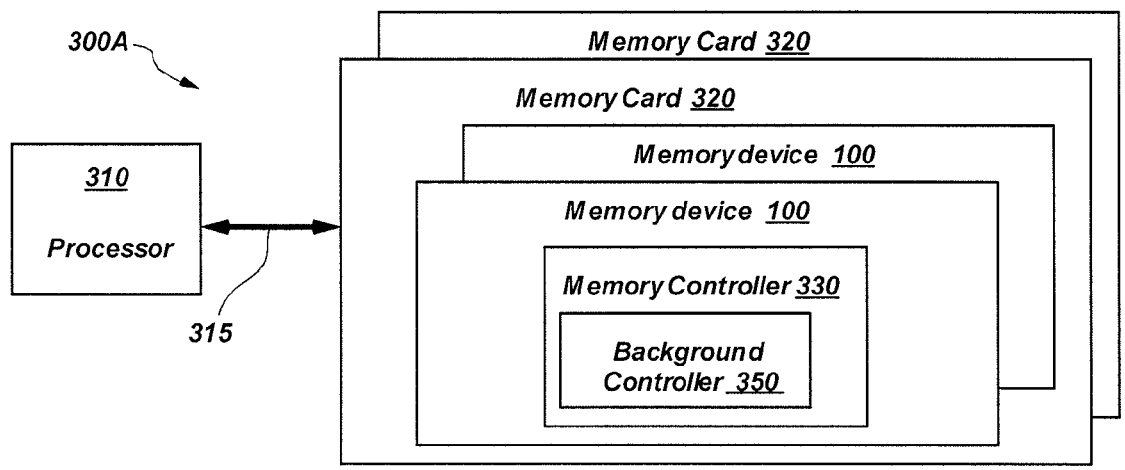
FIG. 4 is a schematic depiction of a memory system including a processor and representative embodiments of memory cards with memory devices disposed thereon, wherein each memory device include a background controller.

FIG. 4 illustrates a block diagram of another memory system 300A including a processor 310 and at least one memory card 320 wherein each memory card 320 includes at least one memory device 100. Some memory devices 100 may include the memory controller 330, and background controller 350, on the memory device 100. In these embodiments, there may be no need for a separate memory controller on the memory card as was illustrated in FIG. 3. Thus, the processor 310 communicates with the memory card 320 across an external bus 315. In addition, this external bus 315 may communicate with the memory devices 100. Of course, those of ordinary skill in the art will recognize that there may be some buffering and timing control (not shown) on the memory card 320 between the external bus 315 and the memory devices 100.

Figure 4A:
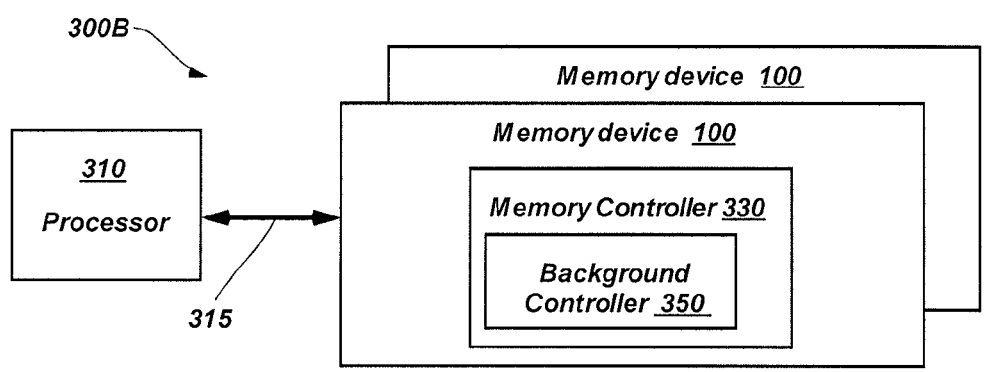
FIG. 4A is a schematic depiction of another memory system including a processor and memory devices, wherein each memory device includes a background controller.

FIG. 4A is a schematic depiction of another memory system 300B including a processor 310 and at least one memory device 100. Many memory systems may not include a memory card 320. Rather, the host may communicate directly with the memory devices 100. Those of ordinary skill in the art will recognize that "directly" is used very loosely. The host processor 310 may include other bus controllers for converting processor cycles to general memory cycles, flash memory device cycles, or combinations thereof. The memory system 300B of FIG. 4A, the memory system 300A of FIG. 4, and the memory system 300 of FIG. 3, may include software, firmware, or combinations thereof for managing flash memory operations.

Figure 5:
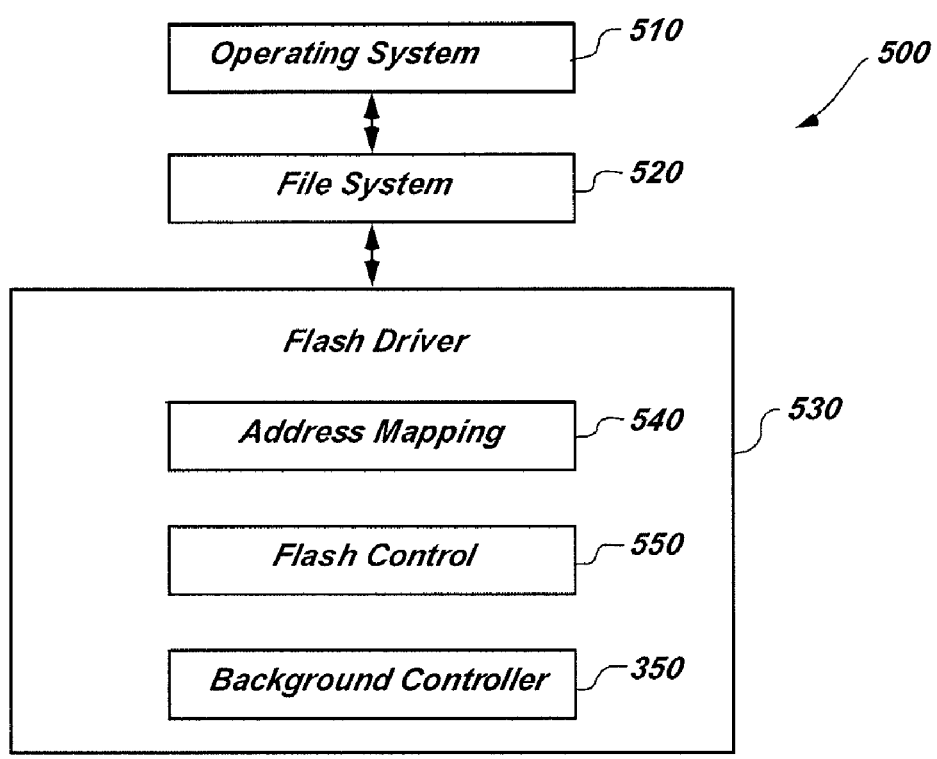
FIG. 5 is a schematic depiction of a software organization, which may be used in the representative embodiments of FIGS. 3, 4, and 4A.

FIG. 5 is a schematic depiction of a software organization 500, which may be used in the representative embodiments of FIGS. 3, 4, and 4A. The software may be organized with an operating system 510 that makes data requests to a file system 520. If the data requests are for flash memory devices 100, the file system 520 may request the data from a flash driver 530.

The flash driver 530 may include components such as address mapping 540 and flash control 550. The address mapping 540 converts addresses in a logical domain associated with the file system 520 to a physical domain associated with locations in the memory device 100. The flash control 550 may be used to convert file requests to bus cycle commands for a memory card 320 or memory device 100. Flash drivers 530, according to the present invention, also include the background controller 350 of FIG. 3A.

Returning to FIG. 3A, the background controller 350 includes logic and flags for managing operations of erase commands in a background mode. A background-process-busy flag 364 indicates that background erases may be in progress or may be waiting to execute. A power-down-soon flag 366 indicates that the processor 310 (i.e., host system) would like to remove power from the memory card 320 or memory devices 100 (FIG. 3) soon. A background enable flag 362 indicates that background erase operations are permissible. Furthermore, in some representative embodiments, the background enable flag 362 may be absent. In those representative embodiments without a background enable flag 362, and according to the descriptions herein, references to the background enable flag 362 will assume operation occurs as if the background enable flag 362 is always asserted.

The background controller 350 may also include a background duration register 368. The background duration register 368 may be a register that is programmed such that the background controller 350 can interpret how much time it has to perform background operations. Alternatively, the background duration register 368 may be set to a time, (e.g., a fixed time, a programmed time, or a time based on how many background operations are pending) such that when the background controller 350 receives a power-down-soon flag 366, the background controller 350 may respond by sending an estimated completion time back to the processor 310. In that mode, the processor 310 could determine when a power down is appropriate without a handshake operation, as is explained more fully below.

According to the present invention, the background controller 350 may be present in the memory devices 100, as hardware in the memory controller 330, as software/firmware in the memory controller 330, as software/firmware in the processor 310, or combinations thereof. The background controller 350 includes logic and flags for managing operations of erase commands in a background mode.

As stated earlier, a flash memory cell is erased to a "1" and may be programmed to a "0." If the data in that memory cell needs to be a one again, the cell needs to be erased. However, flash memory devices 100 are erased a block at a time. As a result, memory systems include procedures for managing how data is programmed and erased. When new data comes in, the flash memory system does not erase the old data and overwrite the new data at the same location. Rather, what the memory system does is tag the old data as bad and writes the new data in some other location while updating an address translation map to point to where the new data is stored. However, some point the controller needs to reclaim the regions that are tagged as bad and move some good data around to make the memory system operate more efficiently.

Remembering that erases occur on blocks of memory, the data management may track how "dirty" a block is getting. In other words, track how many bad locations may be in a block. At some point the memory system may decide to clean a block. To do this, the memory system moves pages with mostly good data to another block. The memory system 300 may also rearrange data to pack good data together and move it to a different block. Once all the good data has been moved to another block, the block in question can then be erased. This house cleaning may degrade overall performance of the memory device 100 by as much as about 10%.

Different memory systems may have different performance characteristics. In many instances, the performance of these memory systems may be directly related to the performance of the memory devices. For example, the throughput of the card is generally related to how fast the data can be stored in the flash memory. There are many other factors as well such as how many memory devices are connected to the controller and how the memory devices may be interleaved to create different memory organizations.

The present invention may increase overall performance of the memory system by performing background erases. In other words, the background controller 350 provides a means for performing some of these house cleaning operations when the memory device 100 is not being accessed by the memory system 300.

However, many memory systems 300 may power up and down the memory devices 100 or memory cards 320 to reduce power consumption. When this power cycling occurs, the memory devices 100 may not be able to perform background erase operations because the duration of power to the memory devices 100 is transient and may be unknown by the memory devices 100.

Block erase operations may be considered house cleaning operations that may impede overall performance of the memory device because normal operations, such as, for example, reads and writes, cannot occur during the block erase.

A first order performance model of a NAND type Flash memory may be approximated as including a write transfer model and a read transfer model. Block erases primarily impact the write transfer model. As a result, the read transfer model is not discussed herein.

A first order write transfer rate may be calculated based on the time needed to fully program and erase one NAND block:

$$Twrite = nbytes/block/((npages/block(nbytes/page*tWC+tPROG))+tBERS)$$

For a typical 512 Mb ×8 device these variables may be:
nbytes/block=number of bytes per block=16896;
npages/block=number of pages per block=32;
nbytes/page=number of bytes per page=528;
tWC=write cycle time=50 nS;
tPROG=program time=200 uS; and
tBERS=block erase time=2 mS.
Therefore, $$Twrite = 16896/((32(528*50\ ns+200\ us))+2\ ms) = 1.8\ MB/sec$$

In embodiments of the present invention, the block erase time may be done during idle time, partially during idle times, or at power down when other operations are not being performed, to improve the overall write transfer rate. Thus, if all block erases are done in the background, the write transfer rate may be as high as:

$$Twrite = 16896/(32(528*50\ ns+200\ us)) = 2.3\ MB/sec$$

One point to notice is that the total work of house cleaning is not changed by performing background erases, so there is no impact on the overall energy requirements of the system. The background controller 350 just performs the erase operation at a different time and in a manner that may improve the overall memory system performance.

The various flags, as illustrated in FIG. 3A, may be implemented in different configurations, wherein some configurations may be more convenient in software implementations and some configurations may be more convenient in hardware implementations. Recall that the memory devices 100 may receive commands and they may also receive read/write cycles to status registers 140 or command registers 150. Thus, the flags may be implemented as a received command bus cycle, a sent response bus cycle, a bit in a status register 140 or command register 150, or a hardware signal. Thus, the background enable flag 362 may be a flag that is set any time a background enable command is received, it may be a background enable bit in a status/command register, it may be a background enable signal 372, or it may be implemented as combinations of the above. Similarly, the background-process-busy flag 364 may be a bus cycle sent out by the background controller 350 indicating a background-process-busy bus response or a background-process-done bus response. The background-process-busy flag 364 may also be a background-process-busy bit in a status/command register, it may be a background-process-busy signal 374, or it may be implemented as combinations of the above. Finally, the power-down-soon flag 366 may be a flag that is set any time a power-down-soon command is received, it may be a power-down-soon bit in a status/command register 150, it may be a power-down-soon signal 376, or it may be implemented as combinations of the above.

Figure 6:
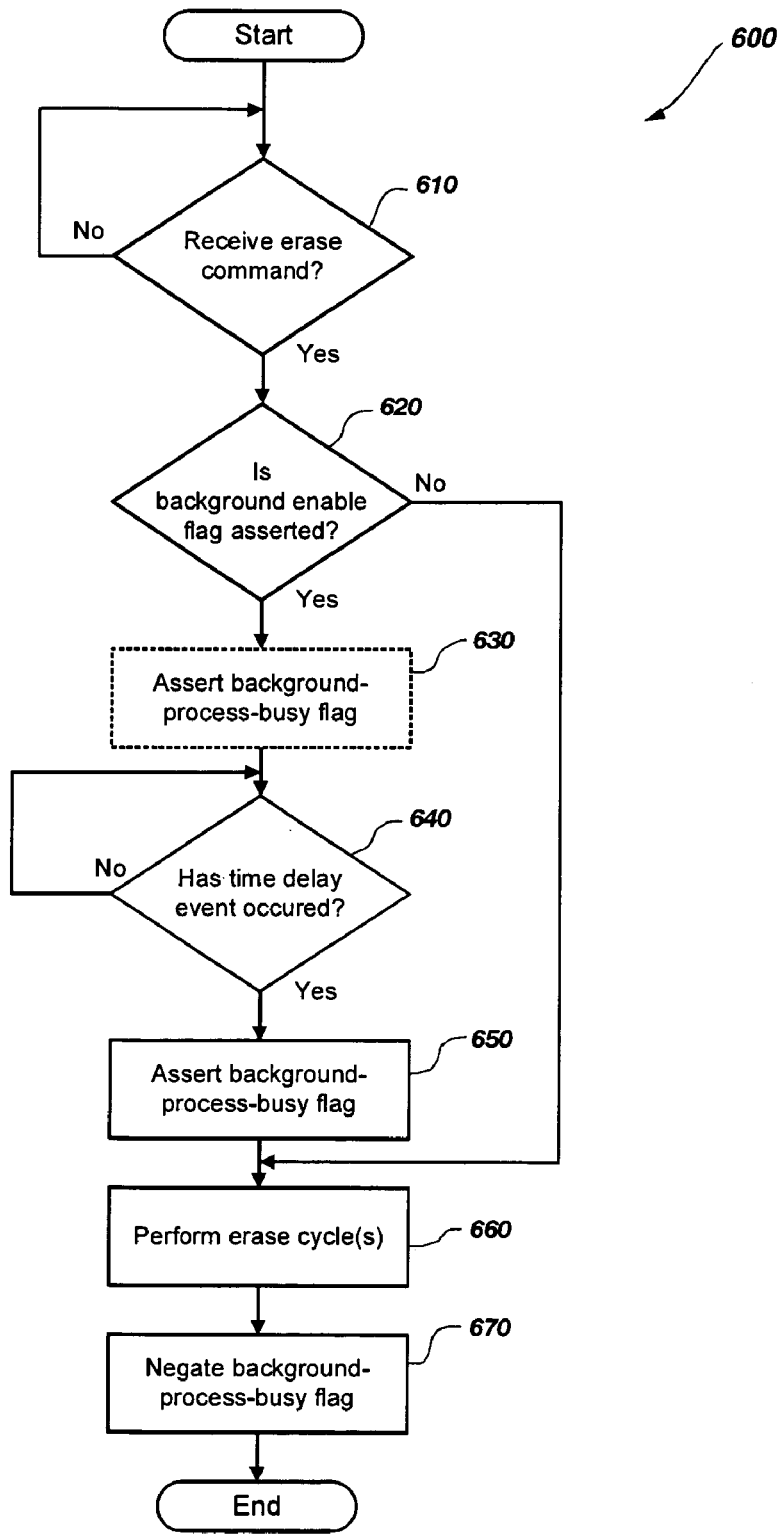
FIG. 6 is a flow chart illustrating a representative process according to the present invention.
Figure 7:
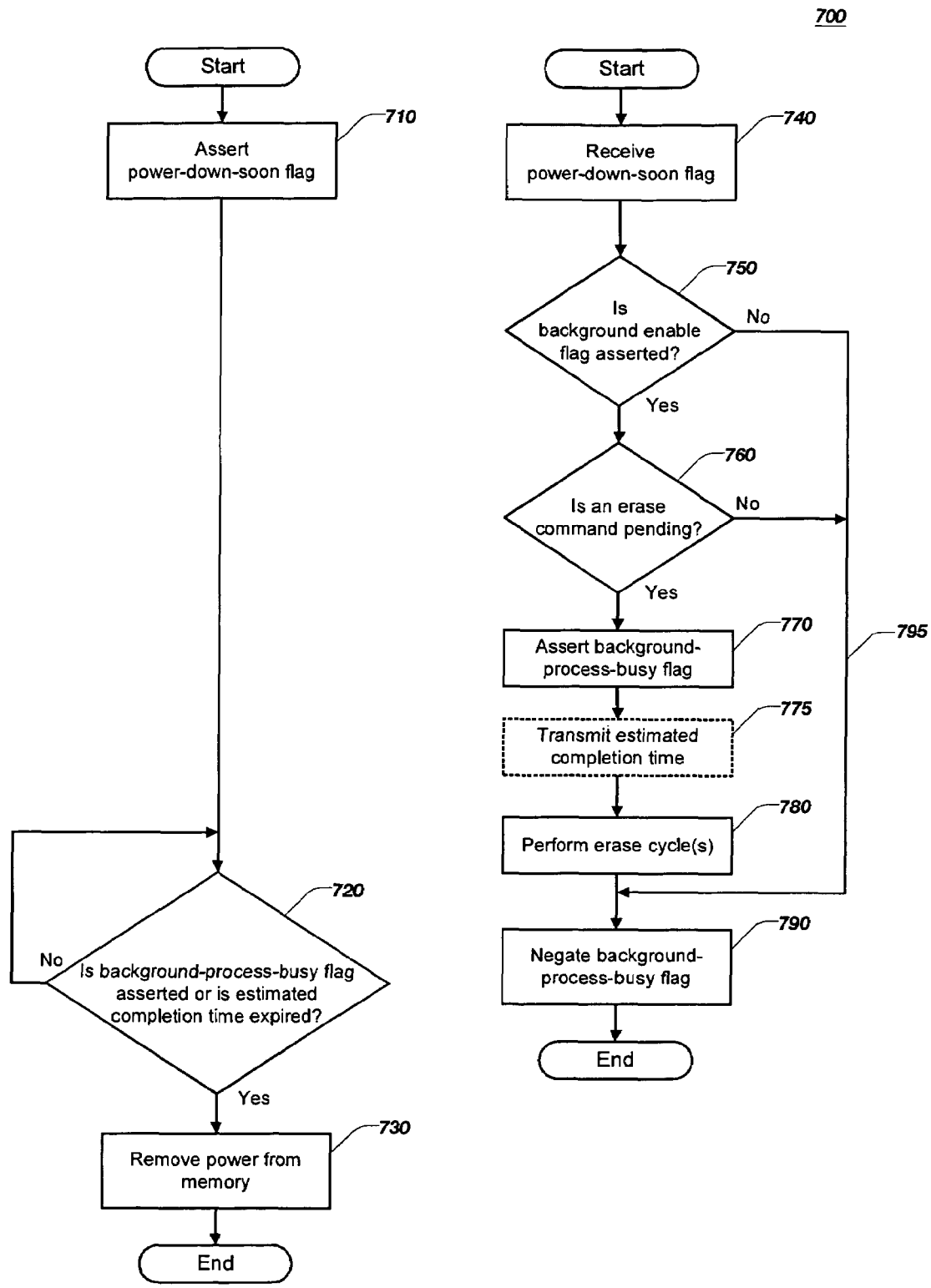
FIG. 7 is a flow chart illustrating another representative process according to the present invention.

Processes 600 and 700, illustrated in FIG. 6 and FIG. 7 respectively, illustrate representative processes that may be performed by the background controller 350 and how the various flags are used. Unless specified otherwise, the order in which the processes are described is not intended to be construed as a limitation. Furthermore, the processes may be implemented in any suitable hardware, software, firmware, or combinations thereof. By way of example, process 600 may be implemented on the memory controller 330 shown in FIG. 3, the memory devices 100 shown in FIGS. 1, 3, 4 and 4A, or the flash driver 530 shown in FIG. 5. Of course, the flash driver 530 may be executed on the processor 310 shown in FIGS. 3, 4 and 4A, the memory controller 330 shown in FIG. 3, or combinations thereof.

When executed as firmware or software, the instructions for performing the processes may be stored on a computer readable medium. A computer readable medium includes, but is not limited to, magnetic and optical storage devices such as disk drives, magnetic tape, CDs (compact disks), DVDs (digital versatile discs or digital video discs), and semiconductor devices such as RAM, DRAM, ROM, EPROM, and Flash memory.

Representative embodiments of the present invention may operate in a background mode during normal operation, wherein the background erases may be performed during idle times to increase overall performance. Process 600, as shown in FIG. 6, illustrates this background mode during normal operation of the memory device. Representative embodiments of the present invention may also operate in a background mode in conjunction with a memory device being powered down in the near future, wherein overall performance may be improved by waiting to perform background erases prior to removal of power at a time period when there is likely to be little or no other activity in the memory device. Process 700, as shown in FIG. 7, illustrates this background mode in conjunction with a memory device being powered down in the near future.

Process 600, illustrated in FIG. 6, includes acts 610-670 and may be used in memory systems where background erases are desirable during normal operation and possibly taking advantage of idle times as well as at power-down times. Process 600 begins at decision block 610, which waits until an erase command is received. The erase command may be accompanied by at least one erasable block address indicating which block to erase in the memory device 100. Process 600 loops on decision block 610 until the erase command is received, then progresses to decision block 620. Decision block 620 tests to see if the background enable flag 362 is asserted, which may be asserted at any time prior to the beginning of process 600. If the background enable flag 362 is not asserted, execution continues at operation block 660, explained below. If the background enable flag 362 is asserted, execution continues at operation block 630, which is shown with a dashed line indicating that the operation is optional.

As stated earlier, some embodiments may not include a background enable flag 362. In those embodiments, decision block 620 may be considered to be absent (i.e., control flows from a true evaluation of decision block 610 and continues at operation block 630), or decision block 620 may be considered to always evaluate true.

At operation block 630, some embodiments may assert the background-process-busy flag 364 at this point to indicate that an erase instruction is pending. Other embodiments may assert the background-process-busy flag 364 later.

Next, decision block 640 loops on itself until a time delay event has occurred. The time delay event may be any number of events. For example, the time delay may be waiting a predetermined time delay measured by a number of clock cycles, waiting until a subsequent command is received, or waiting until a predetermined number of idle cycles have occurred on the bus. The time delay may be configured to attempt to wait until the memory device is idle, such that overall storage performance is improved by not attempting erase cycles while the memory device could be busy performing other operations. In other embodiments, the time delay may be configured to expire when a power-down-soon flag 366 is received. In such embodiments, one or more erase commands may be held off until it is determined that it is almost time to power down, then performing the erase cycle(s) before removing power.

After the time delay event has occurred, the process 600 transitions to operation block 650, where the background-process-busy flag 364 is asserted. Note, that the background-process-busy flag 364 may have been asserted in optional operation block 630, in which case the background-process-busy flag 364 is just being re-asserted. Next, in operation block 660, any pending erase cycle(s) are performed. After the erase cycles are performed, operation block 670 negates the background-process-busy flag 364 to complete process 600.

Those of ordinary skill in the art will recognize that process 600 includes a handshake mechanism wherein an agent issuing the erase command(s) may wait for the background-process-busy flag 364 to be negated in order to determine that the erase command(s) have in fact been executed. This handshake process is even more evident in a somewhat different representative embodiment illustrated in FIG. 7.

FIG. 7 illustrates process 700, which includes acts 710-790 and may be used in memory systems 300 that cycle power frequently. Process 700 includes two processes, one carried out by a requester (including acts 710-730) and another carried out by an executor (including acts 740-790). For example, in FIGS. 3 and 4A, the requester may be the processor 310 while the executor may be the memory controller 330 or the memory devices 100. As another example, in FIGS. 4 and 5, the requester may be the processor 310 and the executor may be the memory devices 100. As even another example, in FIGS. 4 and 5, the requester may be a file system 520 executing on the processor 310, while the executor may be a flash driver 530 executing on the processor 310.

Process 700 begins at operation block 710 with the requester asserting a power-down-soon flag 366. After the power-down-soon flag 366 is asserted, the requester transitions to decision block 720, where it loops, waiting until the background-process-busy flag 364 is no longer asserted. As part of the handshake process, the executor controls the background-process-busy flag 364.

The executor begins operation when it detects the power-down-soon flag 366 asserted, as illustrated by operation block 740. Next, in decision block 750, the background enable flag 362 is tested. If the background enable flag 362 is not asserted, control transitions to operation block 790, since the background erase process is not being used. As stated earlier, some embodiments may not include a background enable flag 362. In those embodiments, decision block 750 may be considered to be absent (i.e., control flows from operation block 740 to decision block 760), or decision block 750 may be considered to always evaluate true.

At decision block 760, a test occurs to see if there are any erase command(s) pending. If not, there is no need for the background erase handshake and control transitions to operation block 790. If there are any erase command(s) pending, control transfers to operation block 770. In operation block 770 the background-process-busy flag 364 is asserted, which is the handshake signal to the requester indicating that it is not yet safe to remove power.

Next, optional operation block 775 may perform the process of sending an estimated completion time back to the processor. If the background controller 350 includes an enabled background duration register 368, the background controller 350 can interpret how much time it has to perform background operations. It may then send the estimated completion time back to the processor 310. In this estimated completion time mode, the processor 310 could determine when a power down is appropriate without a handshake operation.

Next, operation block 780 performs the pending erase operation(s). Finally, at operation block 790, the background-process-busy flag 364 is negated, indicating that power may be removed safely now. Note that if operation block 790 was arrived at from branch 795, the background-process-busy flag 364 would not have been asserted. In other words, branch 795 may also go directly to the end of the executor's process 700 without negating the background-process-busy flag 364, since it was not asserted earlier. Branch 795 is shown going to operation block 790 as a way to reinforce the handshake mechanism of the requester waiting for the background-process-busy flag 364 to be in a negated state. However, in an operation including an estimated completion time, the handshake mechanism may not be required.

After the background-process-busy flag 364 is detected negated, or the estimated completion time has expired, the executor transitions to operation block 730, where it may safely remove power from the memory device 100 without losing any erase command(s).

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A memory device organized in a plurality of erasable blocks, the memory device comprising:
    a background-process-busy flag;
    a background controller configured for:
        receiving at least one erase command and at least one erasable block address;
        asserting the background-process-busy flag;
        generating commands for erasing at least one of the plurality of erasable blocks associated with the at least one erasable block address, wherein the erasing occurs at a time delay after receiving the at least one erase command; and
        negating the background-process-busy flag after the erasing is complete; and
    a background enable flag configured for enabling the background controller when the background enable flag is asserted and disabling the background controller when the background enable flag is negated.

2. The memory device of claim 1, wherein the background enable flag is selected from the group consisting of a background enable bit, a background enable signal, a background enable command, and combinations thereof.

3. The memory device of claim 1, wherein the background-process-busy flag is selected from the group consisting of a background-process-busy bit, a background-process-busy signal, a background-process-busy bus response, a background-process-done bus response, and combinations thereof.

4. The memory device of claim 1, wherein:
    the memory device further comprises a power-down-soon flag;
    the background controller is further configured for receiving the power-down-soon flag; and
    the time delay expires when the power-down-soon flag is received.

5. The memory device of claim 4, wherein the power-down-soon flag is selected from the group consisting of a power-down-soon bit, a power-down-soon signal, a power-down-soon command, and combinations thereof.

6. The memory device of claim 1, wherein the time delay is selected from the group consisting of at a predetermined time delay, after a subsequent command, and after a predetermined number of idle cycles.

7. A memory card, comprising:
    at least one memory device organized in a plurality of erasable blocks;
    a memory controller operably coupled to the at least one memory device and comprising:
        a background-process-busy flag; and
        a background controller configured for:
            receiving at least one erase command and at least one erasable block address;
            asserting the background-process-busy flag;
            generating commands to the at least one memory device for erasing at least one of the plurality of erasable blocks associated with the at least one erasable block, wherein the erasing occurs at a time delay after receiving the at least one erase command; and
            negating the background-process-busy flag after the erasing is complete; and
        a background enable flag configured for enabling operation of the background controller responsive to a state of the background enable flag.

8. The memory card of claim 7, wherein the background enable flag is selected from the group consisting of a background enable bit, a background enable signal, a background enable command, and combinations thereof.

9. The memory card of claim 7, wherein the background-process-busy flag is selected from the group consisting of a background-process-busy bit, a background-process-busy signal, a background-process-busy bus response, a background-process-done bus response, and combinations thereof.

10. The memory card of claim 7, wherein:
the memory controller further comprises a power-down-soon flag;
the background controller is further configured for receiving the power-down-soon flag; and
the time delay expires when the power-down-soon flag is received.

11. The memory card of claim 10, wherein the power-down-soon flag is selected from the group consisting of a power-down-soon bit, a power-down-soon signal, a power-down-soon command, and combinations thereof.

12. The memory card of claim 7, wherein the time delay is selected from the group consisting of at a predetermined time delay, after a subsequent command, and after a predetermined number of idle cycles.

13. A memory system, comprising:
at least one memory device organized in a plurality of erasable blocks; and
a processor operably coupled to the at least one memory device and comprising:
  a background-process-busy flag;
  a background controller configured for:
    receiving at least one erase command and at least one erasable block address;
    asserting the background-process-busy flag;
    generating commands to the at least one memory device for erasing at least one of the plurality of erasable blocks associated with the at least one erasable block, wherein the erasing occurs at a time delay after receiving the at least one erase command; and
    negating the background-process-busy flag after the erasing is complete; and
  a background enable flag configured for enabling the background controller when the background enable flag is asserted and disabling the background controller when the background enable flag is negated.

14. The memory system of claim 13, wherein the background enable flag is selected from the group consisting of a background enable bit, a background enable signal, a background enable command, and combinations thereof.

15. The memory system of claim 13, wherein the background-process-busy flag is selected from the group consisting of a background-process-busy bit, a background-process-busy signal, a background-process-busy bus response, a background-process-done bus response, and combinations thereof.

16. The memory system of claim 13, wherein:
the processor further comprises a power-down-soon flag;
the background controller is further configured for receiving the power-down-soon flag; and
the time delay expires when the power-down-soon flag is received.

17. The memory system of claim 16, wherein the power-down-soon flag is selected from the group consisting of a power-down-soon bit, a power-down-soon signal, a power-down-soon command, and combinations thereof.

18. The memory system of claim 13, wherein the time delay is selected from the group consisting of at a predetermined time delay, after a subsequent command, and after a predetermined number of idle cycles.

19. One or more computer readable media having commands stored thereon, which when executed by a processor cause the processor to perform the acts of:
receiving at least one erase command and at least one erasable block address for at least one memory device organized in a plurality of erasable blocks;
asserting a background-process-busy flag; and
generating commands to the at least one memory device for erasing at least one of the plurality of erasable blocks associated with the at least one erasable block address, wherein the erasing occurs at a time delay after receiving the at least one erase command; and
negating the background-process-busy flag after the erasing is complete;
wherein the act of erasing at least one of the plurality of erasable blocks occurs if a background enable flag is asserted and does not occur if the background enable flag is negated, and wherein the background enable flag is selected from the group consisting of a background enable bit, a background enable signal, a background enable command, and combinations thereof.

20. One or more computer readable media having commands stored thereon, which when executed by a processor cause the processor to perform the acts of:
receiving at least one erase command and at least one erasable block address for at least one memory device organized in a plurality of erasable blocks;
asserting a background-process-busy flag;
generating commands to the at least one memory device for erasing at least one of the plurality of erasable blocks associated with the at least one erasable block address, wherein the erasing occurs at a time delay after receiving the at least one erase command; and
negating the background-process-busy flag after the erasing is complete;
wherein the background-process-busy flag is selected from the group consisting of a background-process-busy bit, a background-process-busy signal, a background-process-busy bus response, a background-process-done bus response, and combinations thereof.

21. One or more computer readable media having commands stored thereon, which when executed by a processor cause the processor to perform the acts of:
receiving at least one erase command and at least one erasable block address for at least one memory device organized in a plurality of erasable blocks;
asserting a background-process-busy flag;
generating commands to the at least one memory device for erasing at least one of the plurality of erasable blocks associated with the at least one erasable block address, wherein the erasing occurs at a time delay after receiving the at least one erase command;
negating the background-process-busy flag after the erasing is complete; and
receiving a power-down-soon flag and wherein the time delay expires when the power-down-soon flag is received.

22. The computer readable media of claim 21, wherein the power-down-soon flag is selected from the group consisting of a power-down-soon bit, a power-down-soon signal, a power-down-soon command, and combinations thereof.

23. One or more computer readable media having commands stored thereon, which when executed by a processor cause the processor to perform the acts of:
receiving at least one erase command and at least one erasable block address for at least one memory device organized in a plurality of erasable blocks;
asserting a background-process-busy flag;
generating commands to the at least one memory device for erasing at least one of the plurality of erasable blocks associated with the at least one erasable block address, wherein the erasing occurs at a time delay after receiving the at least one erase command; and negating the background-process-busy flag after the erasing is complete;

wherein the time delay is selected from the group consisting of at a predetermined time delay, after a subsequent command, and after a predetermined number of idle cycles.

24. A method for performing a background erase in a memory device, comprising:
   receiving at least one erase command and at least one erasable block address for the memory device;
   asserting a background-process-busy flag after receiving the at least one erase command and the at least one erasable block address;
   erasing at least one block in the memory associated with the at least one erasable block address,
   wherein the erasing occurs at a time delay after receiving the at least one erase command; and
   negating the background-process-busy flag after the erasing is complete;
   wherein receiving the at least one erase command and the at least one erasable block address, asserting the background-process-busy flag, and negating the background-process-busy flag are performed by an apparatus selected from the group consisting of the memory device, a memory controller operably coupled to the memory device, a processor operably coupled to the memory device, and combinations thereof.

25. The method of claim 24, further comprising receiving a background enable flag wherein the act of erasing at least one block in the memory occurs if the background enable flag is asserted and does not occur if the background enable flag is negated.

26. The method of claim 25, wherein receiving the background enable flag is performed by an apparatus selected from the group consisting of the memory device, a memory controller operably coupled to the memory device, a processor operably coupled to the memory device, and combinations thereof.

27. The method of claim 25, wherein receiving the background enable flag further comprises a process selected from the group consisting of setting a background enable bit, detecting a background enable signal, receiving a background enable command, and combinations thereof.

28. The method of claim 24, wherein asserting the background-process-busy flag comprises a process selected from the group consisting of setting a background-process-busy bit, asserting a background-process-busy signal, transmitting a background-process-busy bus response, and combinations thereof.

29. The method of claim 24, wherein negating the background-process-busy flag comprises a process selected from the group consisting of clearing a background-process-busy bit, negating a background-process-busy signal, transmitting a background-process-done bus response, and combinations thereof.

30. The method of claim 24, further comprising receiving a power-down-soon flag and wherein the time delay expires when the power-down-soon flag is received.

31. The method of claim 30, wherein receiving the power-down-soon flag is selected from the group consisting of detecting a power-down-soon signal, receiving a power-down-soon command, setting a power-down-soon bit, and combinations thereof.

32. The method of claim 30, further comprising removing power from the memory device after negating the background-process-busy flag.

33. The method of claim 24, wherein the time delay is selected from the group consisting of at a predetermined time delay, after a subsequent command, and after a predetermined number of idle cycles.

34. A method for performing a background erase in a memory device, comprising:
   receiving a power-down-soon flag, wherein the power-down-soon flag is selected from the group consisting of a power-down-soon signal, a power-down-soon command, a power-down-soon bit, and combinations thereof; and
   determining if at least one erase command is pending for the memory device, and if so:
      asserting a background-process-busy flag;
      erasing at least one block in the memory device associated with the at least one erase command; and
      negating the background-process-busy flag after the erasing is complete.

35. The method of claim 34, wherein receiving the power-down-soon flag, asserting the background-process-busy flag, and negating the background-process-busy flag are performed by an apparatus selected from the group consisting of the memory device, a memory controller operably coupled to the memory device, a processor operably coupled to the memory device, and combinations thereof.

36. The method of claim 34, further comprising receiving a background enable flag wherein the act of erasing at least one block in the memory occurs if the background enable flag is asserted and does not occur if the background enable flag is negated.

37. The method of claim 36, wherein receiving the background enable flag is performed by an apparatus selected from the group consisting of the memory device, a memory controller operably coupled to the memory device, a processor operably coupled to the memory device, and combinations thereof.

38. The method of claim 34, further comprising:
   detecting the background-process-busy flag negated; and
   removing power from the memory device after the detecting.

39. The method of claim 34, wherein asserting the background-process-busy flag comprises a process selected from the group consisting of setting a background-process-busy bit, asserting a background-process-busy signal, transmitting a background-process-busy bus response, and combinations thereof.

40. The method of claim 34, wherein negating the background-process-busy flag comprises a process selected from the group consisting of clearing a background-process-busy bit, negating a background-process-busy signal, transmitting a background-process-done bus response, and combinations thereof.

41. A method for performing a background erase in a memory device, comprising:
   receiving a power-down-soon flag, wherein the power-down-soon flag is selected from the group consisting of a power-down-soon signal, a power-down-soon command, a power-down-soon bit, and combinations thereof; and
   determining if at least one erase command is pending for the memory device, and if so:
      transmitting an estimated completion time for the at least one erase time; and
      erasing at least one block in the memory device associated with the at least one erase command.

42. The method of claim 41, wherein receiving the power-down-soon flag and transmitting the estimated completion time are performed by an apparatus selected from the group consisting of the memory device, a memory controller operably coupled to the memory device, a processor operably coupled to the memory device, and combinations thereof.

43. The method of claim 41, further comprising receiving a background enable flag wherein the act of erasing at least one block in the memory occurs if the background enable flag is asserted and does not occur if the background enable flag is negated.

44. The method of claim 43, wherein receiving the background enable flag is performed by an apparatus selected from the group consisting of the memory device, a memory controller operably coupled to the memory device, a processor operably coupled to the memory device, and combinations thereof.

45. The method of claim 41, further comprising:

waiting for a duration of the estimated completion time; and removing power from the memory device after the duration.

46. The method of claim 41, wherein receiving the power-down-soon flag is selected from the group consisting of detecting a power-down-soon signal, receiving a power-down-soon command, setting a power-down-soon bit, and combinations thereof.

* * * * *